(12) United States Patent
Khosrowbeygi et al.

(10) Patent No.: US 6,804,499 B2
(45) Date of Patent: Oct. 12, 2004

(54) POWER-MIXER ARCHITECTURE FOR A TRANSMITTER

(75) Inventors: Abolfazl Khosrowbeygi, Sunnyvale, CA (US); Petrus M. Stroet, Sunnyvale, CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 584 days.

(21) Appl. No.: 09/829,105

(22) Filed: Apr. 9, 2001

(65) Prior Publication Data

US 2002/0146991 A1 Oct. 10, 2002

(51) Int. Cl.[7] .......................... H01Q 11/12; H04B 1/04
(52) U.S. Cl. ............................ 455/118; 455/91; 455/84
(58) Field of Search .................................. 455/118, 351, 455/361, 90.2, 91, 87, 84, 347, 74, 300; 257/723, 724, 675; 330/96, 75, 127, 134

(56) References Cited

U.S. PATENT DOCUMENTS 5,196,742 A 3/1993 McDonald

FOREIGN PATENT DOCUMENTS

DE 197 54 114 A1 11/1998
EP 0 565 299 A1 3/1993

OTHER PUBLICATIONS

An article entitled, "A Low Distortion Bipolar Mixer for Low Voltage Direct Up–Conversion and High IF Systems", (Authors, Farbod Behbahani, Ali Fotowat, Saeed Navid, Rainer Gaethke, and Michael Delurio, IEEE Journal of Solid–State Circuits, vol. 32, No. 9, Dated Sep. 1997, pp. 1446–1450).

*Primary Examiner*—Nick Corsaro
*Assistant Examiner*—Edan Orgad
(74) *Attorney, Agent, or Firm*—Dicran Halajian

(57) ABSTRACT

A power mixer architecture for a transmitter chip is disclosed. The power mixer architecture is a mixing stage including one or more upper trees, and one or more lower trees. Each lower tree is selectively activated to receive current biasing signals, and current intermediate frequency signals. Upon receipt, the activated lower tree activates a corresponding upper tree to receive one or more amplified current intermediate frequency signals from the lower tree. In conjunction with a reception of voltage local oscillating signals, the upper tree provides voltage radio frequency signals. The gain of the lower tree is designed to be constant over any variance in a temperature, supply voltage or processing performance of the transmitter chip.

15 Claims, 17 Drawing Sheets

AMPERES (mA)

$X_3$ — $I_{BS1}$

TIME (msec)

AMPERES (mA)

$X_4$ — $I_{BS2}$

TIME (msec)

AMPERES (mA)

$X_6$ — $I_{BS3}$

TIME (msec)

AMPERES (mA)

$X_6$ — $I_{BS4}$

TIME (msec)

AMPERES (mA)

$X_7$ — $I_{BS5}$

TIME (msec)

FIG. 2B

POWER-MIXER ARCHITECTURE FOR A TRANSMITTER

BACKGROUND OF THE INVENTION

1. Field of the Invention

The present invention generally relates to transmitters. The present invention specifically relates to architecture of a power-mixer.

2. Description of the Related Art

In prior art up-converter transmitter architectures, the mixer is driven in a voltage mode of operation and is coupled to an output driver. Generally, achieving the higher output power requires driving the mixer harder, which moves the mixer into a non-linear operating range. Additionally, in order to maximize the power efficiency, the mixer needs to be impedance matched with the output driver. The impedance matching requires an off-chip inductor. The impedance matching also increases pin count of the transmitter.

What is therefore needed is an improved technique for generating medium linear power in a transmitter chip at relatively good efficiency and without utilizing on-chip impedance matching inductors.

SUMMARY OF THE INVENTION

The present invention relates to a power mixer architecture for a transmitter chip. Various aspects of the invention are novel, non-obvious, and provide various advantages. While the actual nature of the present invention covered herein can only be determined with reference to the claims appended hereto, certain features, which are characteristic of the embodiments disclosed herein, are described briefly as follows.

One form of the present invention is a mixing stage of a transmitter chip comprising a lower tree and an upper tree. The lower tree is operable provide a current intermediate frequency signal in response to a reception of a second current intermediate frequency signal and a current biasing signal. The upper tree operable to provide a voltage radio frequency signal in response to the current intermediate frequency signal.

A second form of the present invention is a mixing stage of a transmitter chip comprising an upper tree including a switching circuit and a lower tree including a current amplifier. The current amplifier is operable to turn on the switching circuit in response to a reception of a current intermediate frequency signal and a current biasing signal.

A third form of the present invention is a transmitter chip comprising a biasing stage, a phase shifting stage, a local oscillator driver stage, and a mixing stage. The biasing stage is operable to provide a plurality of current biasing signals to the mixing stage. The phase shifting stage is operable to provide a plurality of current intermediate frequency signals to the mixing stage. The local oscillator driver stage is operable to provide a plurality of voltage local oscillating signals to the mixing stage. The mixing stage is operable to provide a first voltage radio frequency signal and a second voltage radio frequency signal in response to a reception of the current biasing signals, the current intermediate frequency signals, and the voltage local oscillating signals.

The foregoing forms and other forms, features and advantages of the present invention will become further apparent from the following detailed description of the presently preferred embodiments, read in conjunction with the accompanying drawings. The detailed description and drawings are merely illustrative of the present invention rather than limiting, the scope of the present invention being defined by the appended claims and equivalents thereof.

BRIEF DESCRIPTION OF THE DRAWINGS

FIG. 2B illustrates five (5) DC current biasing signals provided by a biasing stage of the FIG. 1 transmitter chip;

DETAILED DESCRIPTION OF THE PRESENTLY PREFERRED EMBODIMENTS

Figure 1:
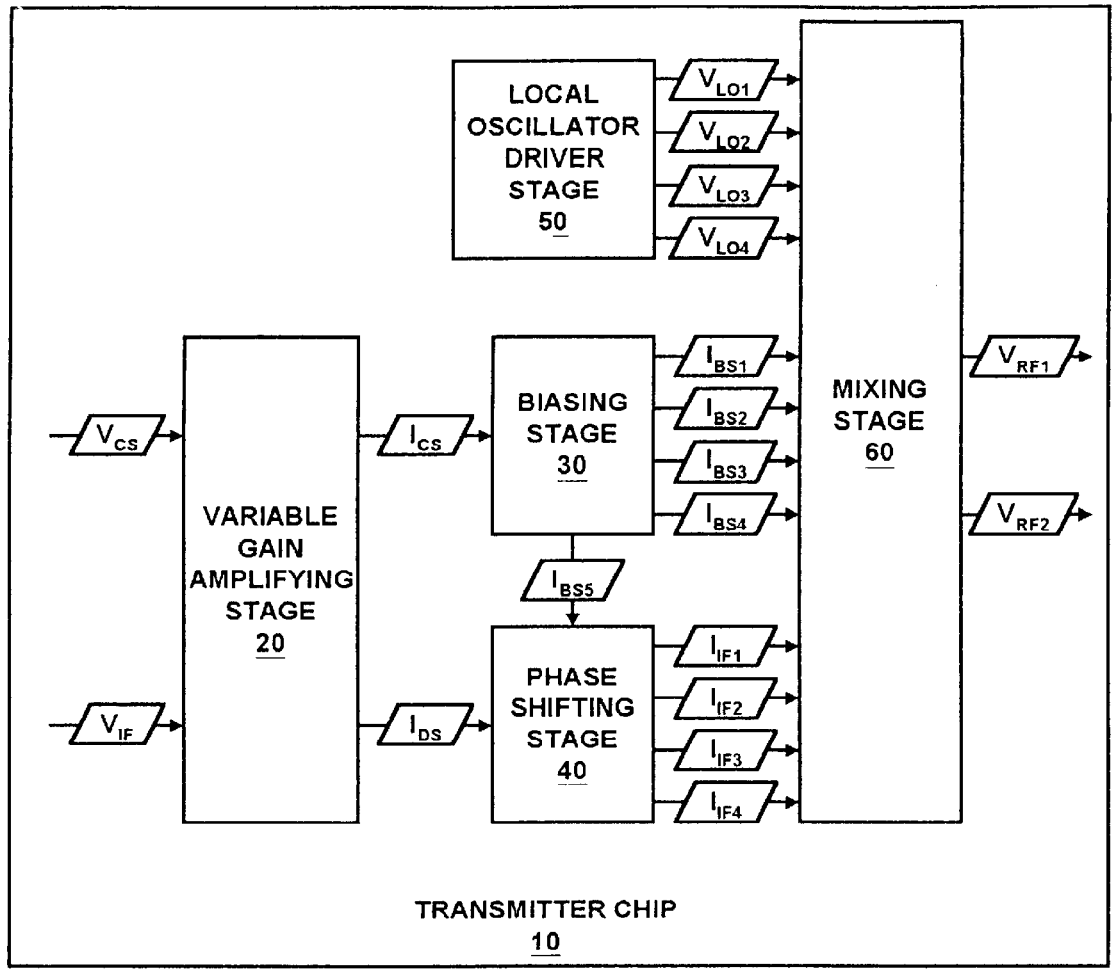
FIG. 1 is a block diagram of one embodiment of a transmitter power mixer chip in accordance with the present invention.

A block diagram of a transmitter chip 10 of the present invention is shown in FIG. 1. Referring to FIG. 1, transmitter chip 10 comprises a variable gain amplifying stage 20, a biasing stage 30, a phase shifting stage 40, a local oscillator driver stage 50, and a mixing stage 60 for implementing the principles of the present invention. Other stages and components of transmitter 10 are not shown for the clarity of describing the present invention. However, from the subsequent description herein of stage 20, stage 30, stage 40, stage 50, and stage 60 of transmitter chip 10, those having ordinary skill in the art will appreciate such additional stages and components of transmitter chip 10. Also, those having ordinary skill in the art will appreciate that transmitter chip 10 operates in a current mode of operation as opposed to the prior art manner of operating transmitter chips in a voltage mode of operation.

Figure 2A:
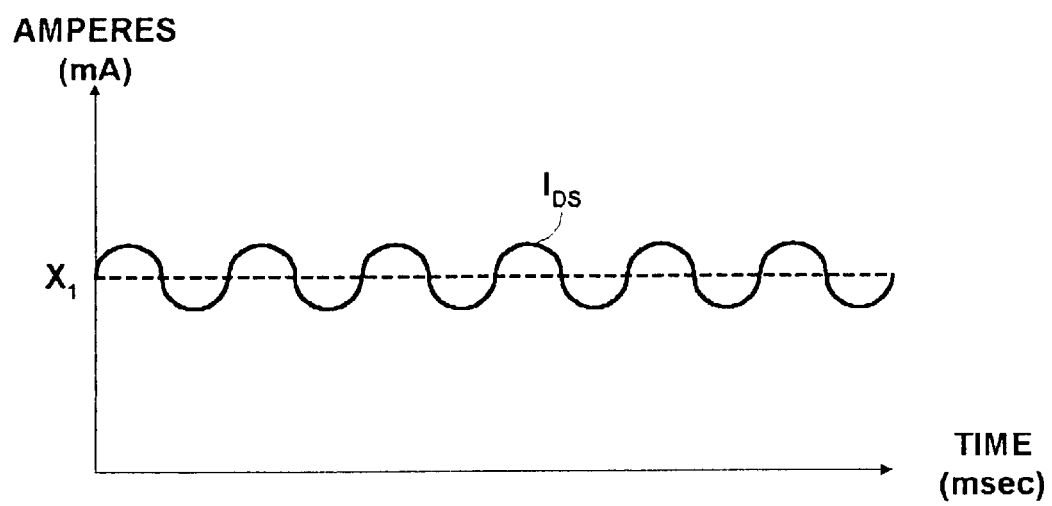
FIG. 2A illustrates a current drive signal and a DC current control signal provided by a variable gain amplifying stage of the FIG. 1 transmitter chip.
Figure 2A:
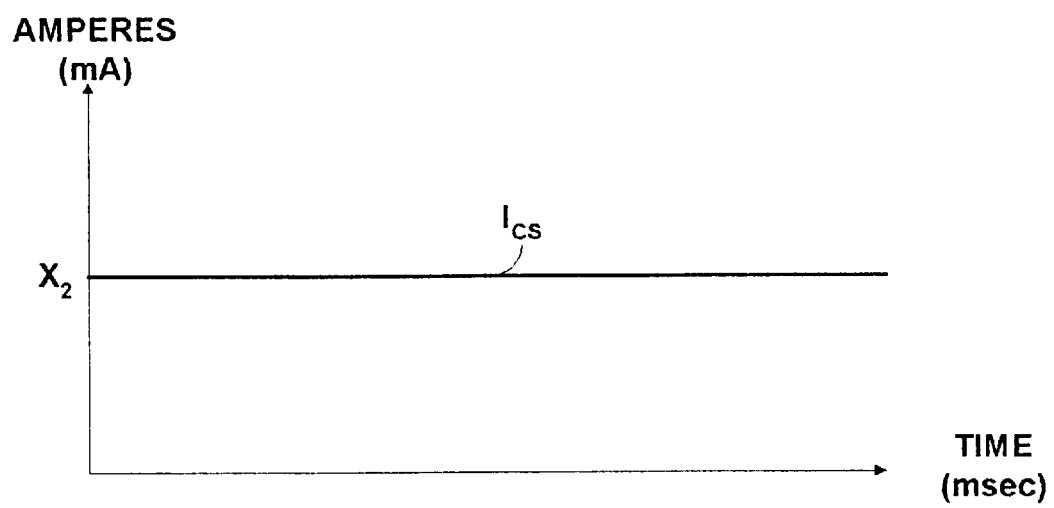

Referring to FIGS. 1 and 2A, variable gain amplifying stage 20 receives a DC voltage control signal $V_{CS}$ from an allocated pin for gain control (not shown) of transmitter chip 10 and a voltage signal $V_{IF}$ at intermediate frequency (e.g., 150 MHz to 250 MHz) from an I/Q modulator block (not shown) of transmitter chip 10. In response thereto, variable gain amplifying stage 20 provides a current drive signal $I_{DS}$ to phase shifting stage 40 and a DC current control signal $I_{CS}$ to biasing stage 30. Current drive signal $I_{DS}$ has an AC current component and a DC current component. An ampere level $X_1$ of the DC component of current drive signal $I_{DS}$ as shown in FIG. 2A and an ampere level $X_2$ of DC current control signal $I_{CS}$ as shown in FIG. 2A are immune to any variances in an operating temperature, a processing performance, and a supply power of transmitter chip 10. Ampere level $X_1$ of the DC component of current drive signal $I_{DS}$ and ampere level $X_2$ of DC current control signal $I_{CS}$ change in response to any change in the voltage level of voltage control signal $V_{CS}$. However, to establish a high degree of insensitivity to any change in the voltage level of voltage control signal $V_{CS}$, a ratio $Y_1$ of ampere level $X_1$ to ampere level $X_2$ (i.e., $Y_1=X_1/X_2$) remains constant.

Referring to FIGS. 1, 2A, and 2B, in response to current control signal $I_{CS}$, biasing stage 30 outputs four (4) DC current biasing signals $I_{BS1-BS4}$ to mixing stage 60, and a DC current biasing signal $I_{BS5}$ to phase shifting stage 40. As shown in FIG. 2B, ampere levels $X_{3-7}$ of DC current biasing signals $I_{BS1-S5}$, respectively, are designed to be identical. Ampere levels $X_{3-7}$ are also dynamically varied in response to any change in ampere level $X_2$ of DC current control signal $I_{CS}$ with ratios $Y_{2-6}$ of ampere levels $X_{3-7}$ to ampere level $X_2$ (i.e., $Y_2=X_3/X_2$; $Y_3=X_4/X_2$; $Y_4=X_5/X_2$; $Y_5=X_6/X_2$; and $Y_6=X_7/X_2$) remaining constant. Those having ordinary skill in the art will appreciate various conventional embodiments of biasing stage 30, such as, for example, current mirrors.

Figure 2C:
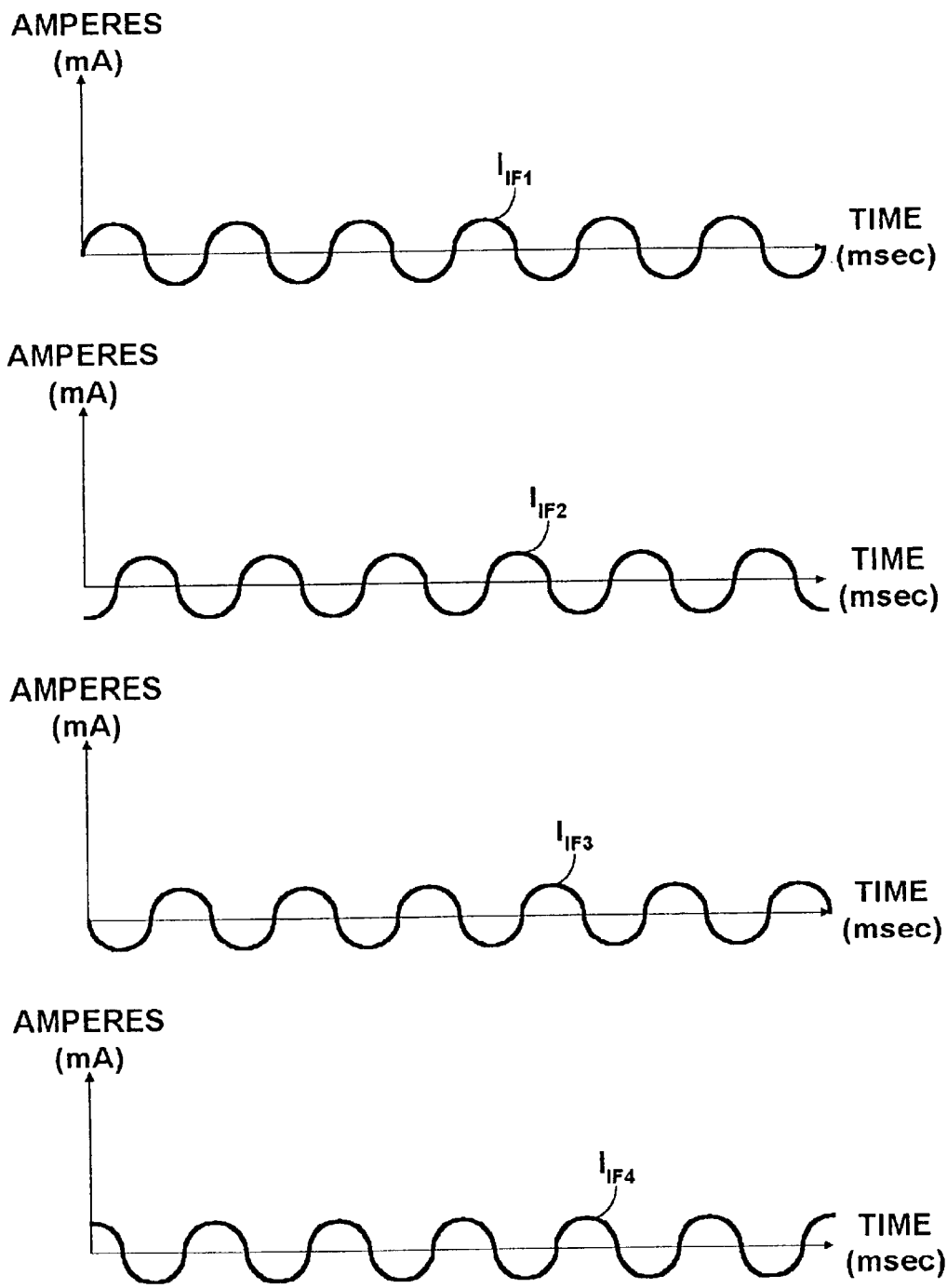
FIG. 2C illustrates four (4) current intermediate frequency signals as provided by a phase shifting stage of the FIG. 1 transmitter chip.

Referring to FIGS. 1, 2A and 2C, in response to current drive signal $I_{DS}$ and DC current biasing signal $I_{BS5}$, phase shifting stage 40 provides four (4) current signals $I_{IF1-IF4}$ at an intermediate frequency (e.g., 150 MHz to 250 MHz) and phase shifted by 90 degrees to mixing stage 60. Each current intermediate frequency signals $I_{IF1-IF4}$ has a current component and a DC current component. Those having ordinary skill in the art will appreciate various conventional embodiments of phase shifting stage 40, such as, for example, poly-phase phase shifter stages, buffer amplifiers and the like.

Figure 2D:
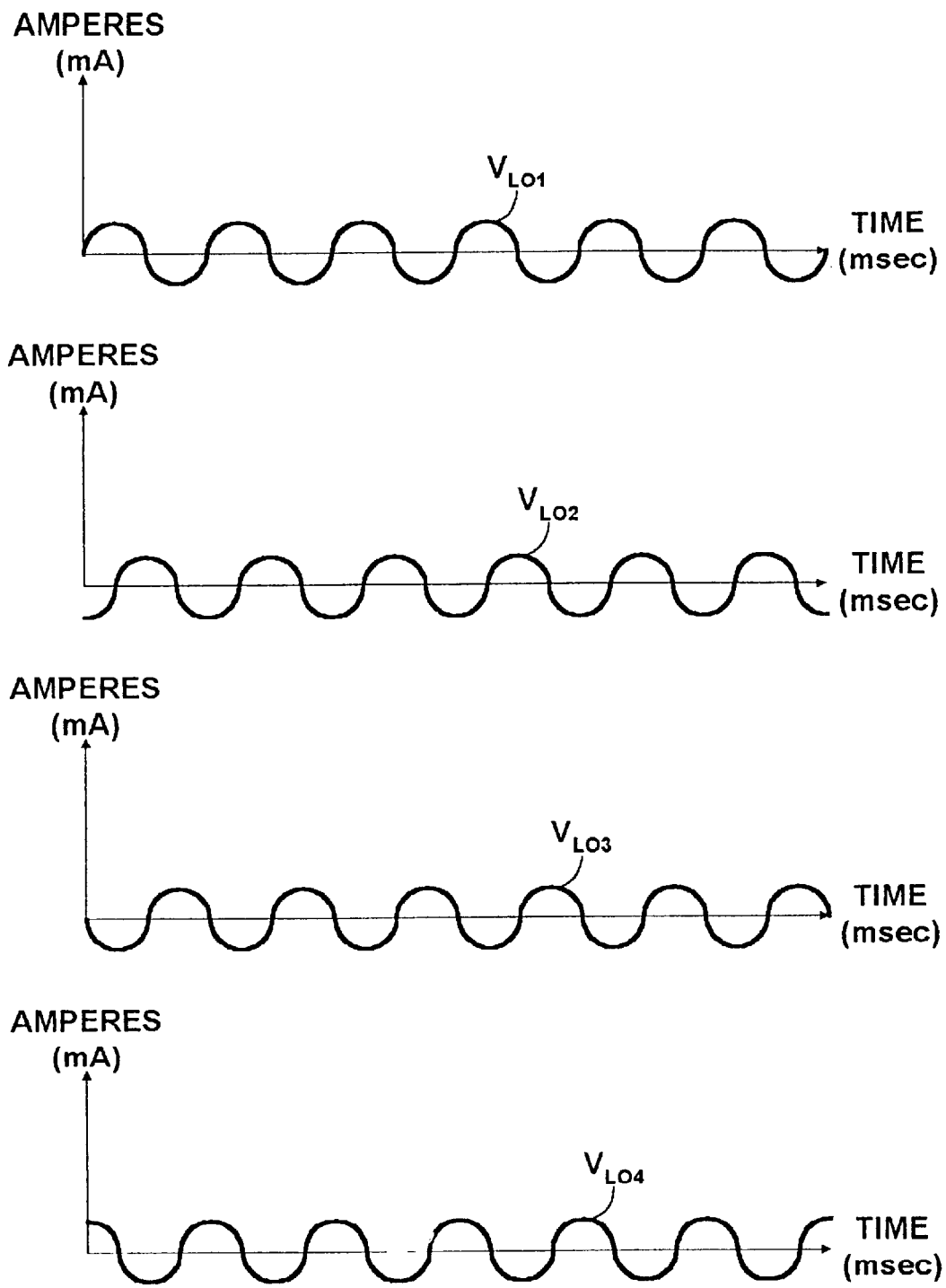
FIG. 2D illustrates four (4) voltage local oscillating signals as provided by a local oscillator driver stage of the FIG. 1 transmitter chip.

Referring to FIGS. 1 and 2D, local oscillator driver stage 50 provides four (4) voltage signals $V_{LO1-LO4}$ at a local oscillator frequency (e.g., ≈1000 MHz for a cellular mode and ≈1700 MHz for a personal communication system (PCS) mode) to mixing stage 60. As shown in FIG. 2D, voltage local oscillating signals $V_{LO1-LO4}$ are phase shifted by 90 degrees. Those having ordinary skill in the art will appreciate various conventional embodiments of local oscillator driver stage 50, such as, for example, an RC phase shifter network and buffer amplifiers.

Figure 2E:
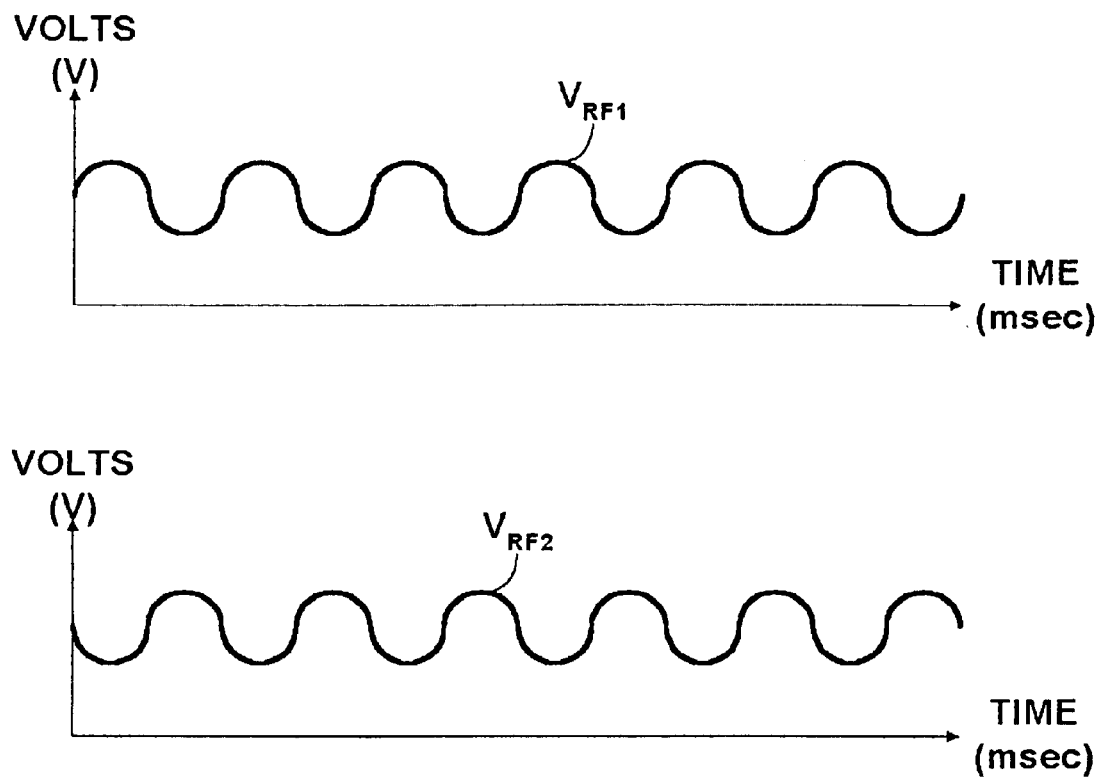
FIG. 2E illustrates two (2) voltage radio frequency signals as provided by a mixing stage of the FIG. 1 transmitter chip.

Referring to FIGS. 1 and 2E, in response to DC current biasing signals $I_{BS1-BS4}$, current intermediate frequency signals $I_{IF1-IF4}$, and voltage local oscillating signals $V_{LO1-LO4}$, mixing stage 60 provides a pair of differential voltage signals $V_{RF1}$ and $V_{RF2}$ at a radio frequency (e.g., 900 MHz to 1900 MHz) to an external balun (not shown) of transmitter chip 10. Voltage radio frequency signal $V_{RF1}$ and voltage radio frequency signal $V_{RF2}$ each have an AC voltage component and a DC voltage component. As shown in FIG. 2E, voltage radio frequency signal $V_{RF2}$ is 180 degrees out of phase from voltage radio frequency signal $V_{RF1}$ with the peak-to-peak amplitudes of the signals being identical.

Figure 3:
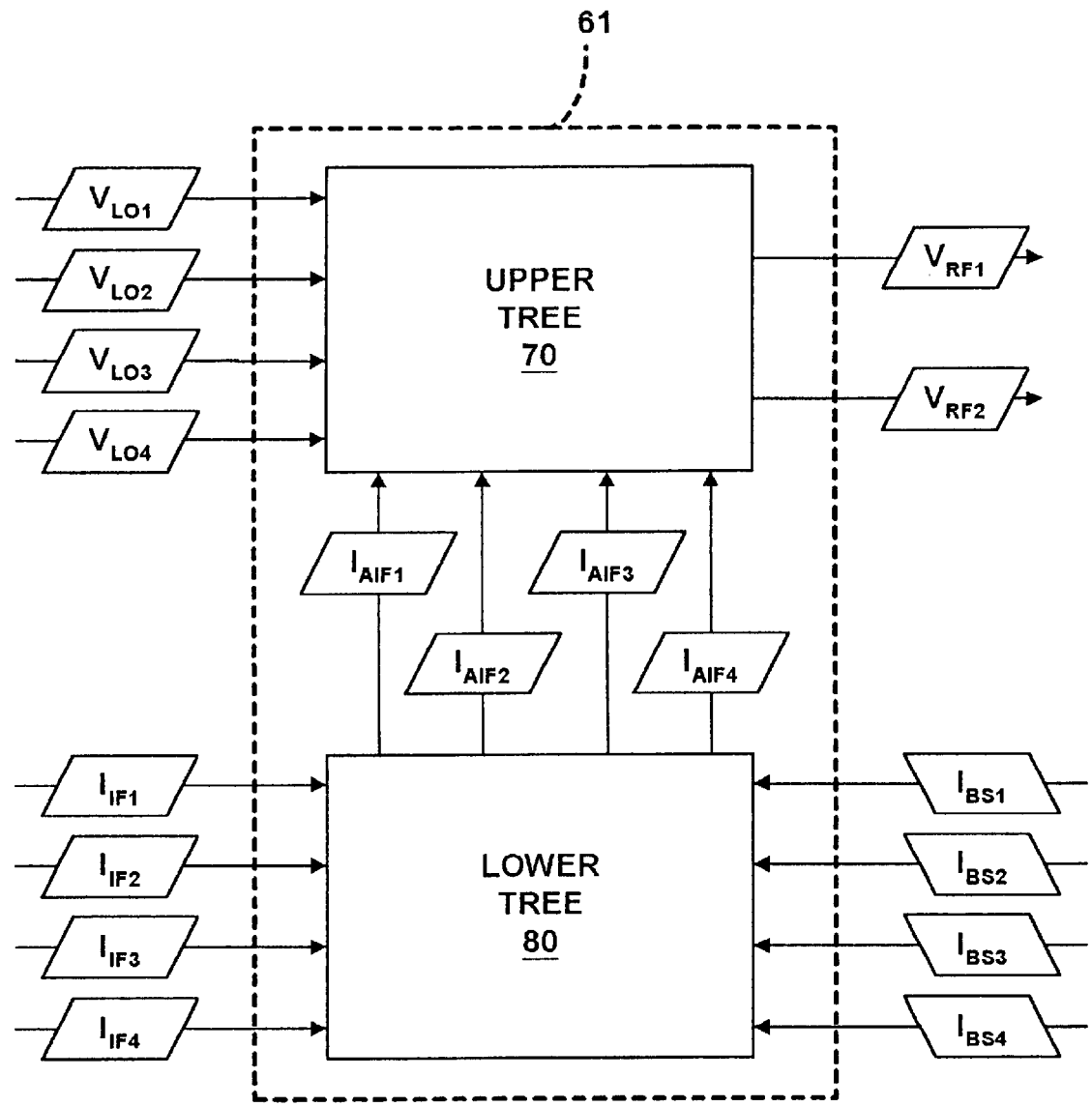
FIG. 3 is a block diagram of one embodiment in accordance with the present invention of the FIG. 1 mixing stage.

Referring to FIG. 3, a mixing stage 61 as a first embodiment of mixing stage 60 (FIG. 1) is shown. Mixing stage 61 includes an upper tree 70 and a lower tree 80. In response to current intermediate frequency signals $I_{IF1-IF4}$ and DC current biasing signals $I_{BS1-BS4}$, lower tree 80 provides four (4) current signals $I_{AIF1-AIF4}$ at an intermediate frequency (e.g., 150 MHz to 250 MHz) and phase shifted by 90 degrees to upper tree 70. The current intermediate frequency signals $I_{AIF1-AIF4}$ are amplified versions of current intermediate frequency signals $I_{IF1-IF4}$, respectively. In response to voltage local oscillating signals $V_{LO1-LO4}$ and current intermediate frequency signals $I_{AIF1-AIF4}$, upper tree 70 provides voltage radio frequency signals $V_{RF1-RF2}$. Those having ordinary skill in the art will appreciate that mixing stage 61 facilitates a direct control of the ampere amplitudes of current intermediate frequency signals $I_{IF1-IF4}$ as opposed to a direct control of the ampere amplitudes of voltage radio frequency signals $V_{RF1-RF2}$.

Referring to 4, a more detailed embodiment of upper tree 70 and lower tree 80 is shown.

A first branch of lower tree 80 includes a switching circuit 81 and a current mirror 82 constituting a current amplifier, and a first branch of upper tree 70 includes a switching circuit 71. Switching circuit 81 includes a switch S1 and an NPN transistor T1. Current mirror 82 includes an NPN transistor T2, an NPN transistor T3, a resistor R1, a resistor R2, and a resistor R3. Switching circuit 71 includes an NPN transistor T13 and an NPN transistor T14.

Transistor T1 has a collector terminal electrically coupled to a supply terminal SUPPLY$_1$, and a base terminal electrically coupled to switch S1. Switch S1 receives a control signal (not shown) from a control block (not shown) of transmitter chip 10 (FIG. 1) that controls a selective opening and closing of switch S1. Transistor T2 has a collector terminal electrically coupled in parallel with switch S1 to an input terminal INPUT$_1$. Transistor T2 also has an emitter terminal electrically coupled to a resistor R1.

Transistor T3 has a base terminal electrically coupled to an emitter terminal of transistor T1, a base terminal of transistor T2, and resistor R2. A collector terminal of transistor T3 is electrically coupled to both an emitter terminal of transistor T13 and an emitter terminal of transistor T14. An emitter terminal of transistor T3 is electrically coupled to resistor R3. Resistors R1–R3 are electrically coupled in parallel to a ground GND.

Transistor T13 has a collector terminal electrically coupled to an output terminal OUTPUT$_1$, and transistor T14 has a collector terminal electrically coupled to an output terminal OUTPUT$_2$.

Figure 4:
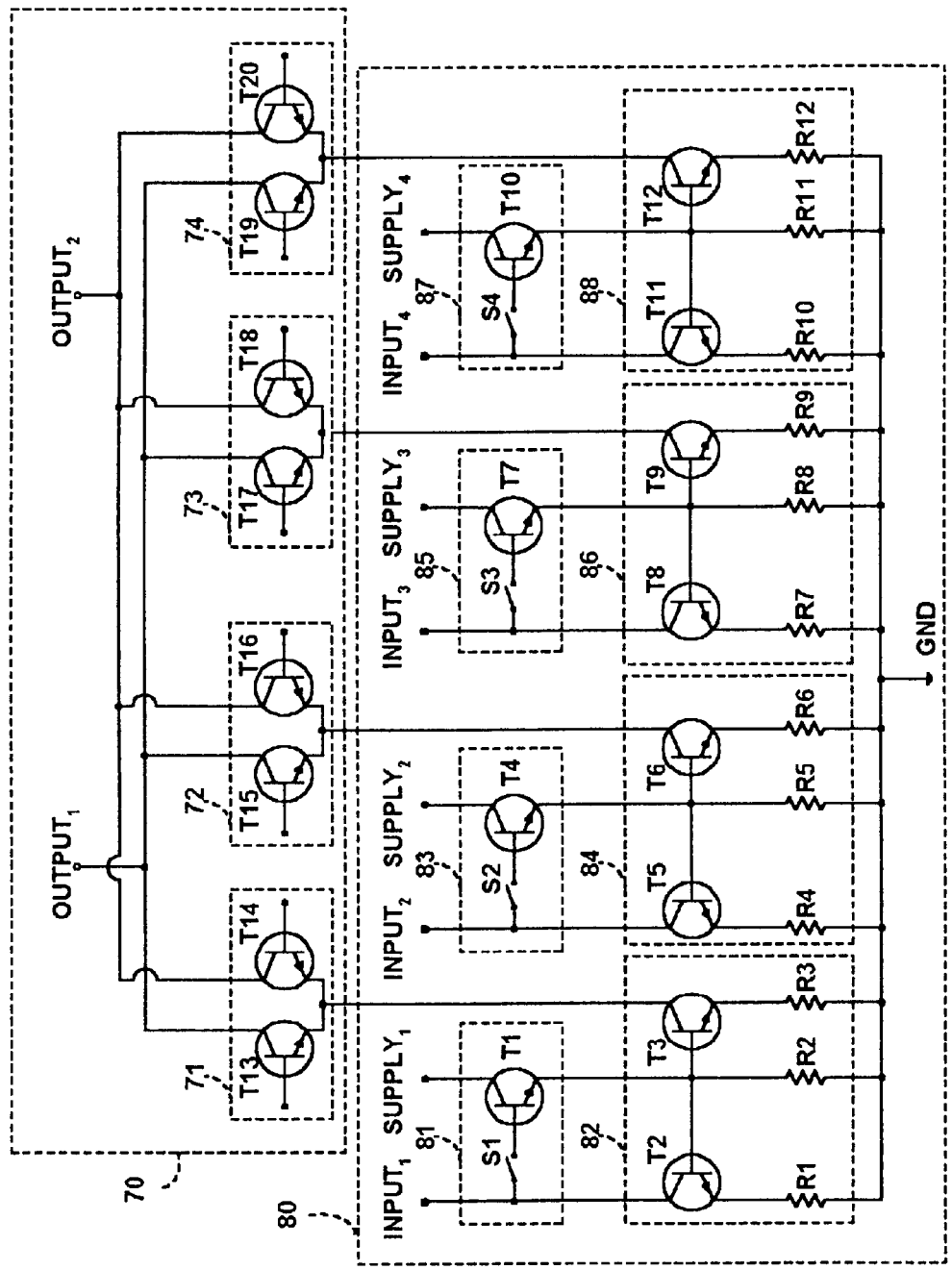
FIG. 4 is a schematic diagram of a first embodiment in accordance with the present invention of a power mixer of the FIG. 2 mixing stage.
Figure 5A:
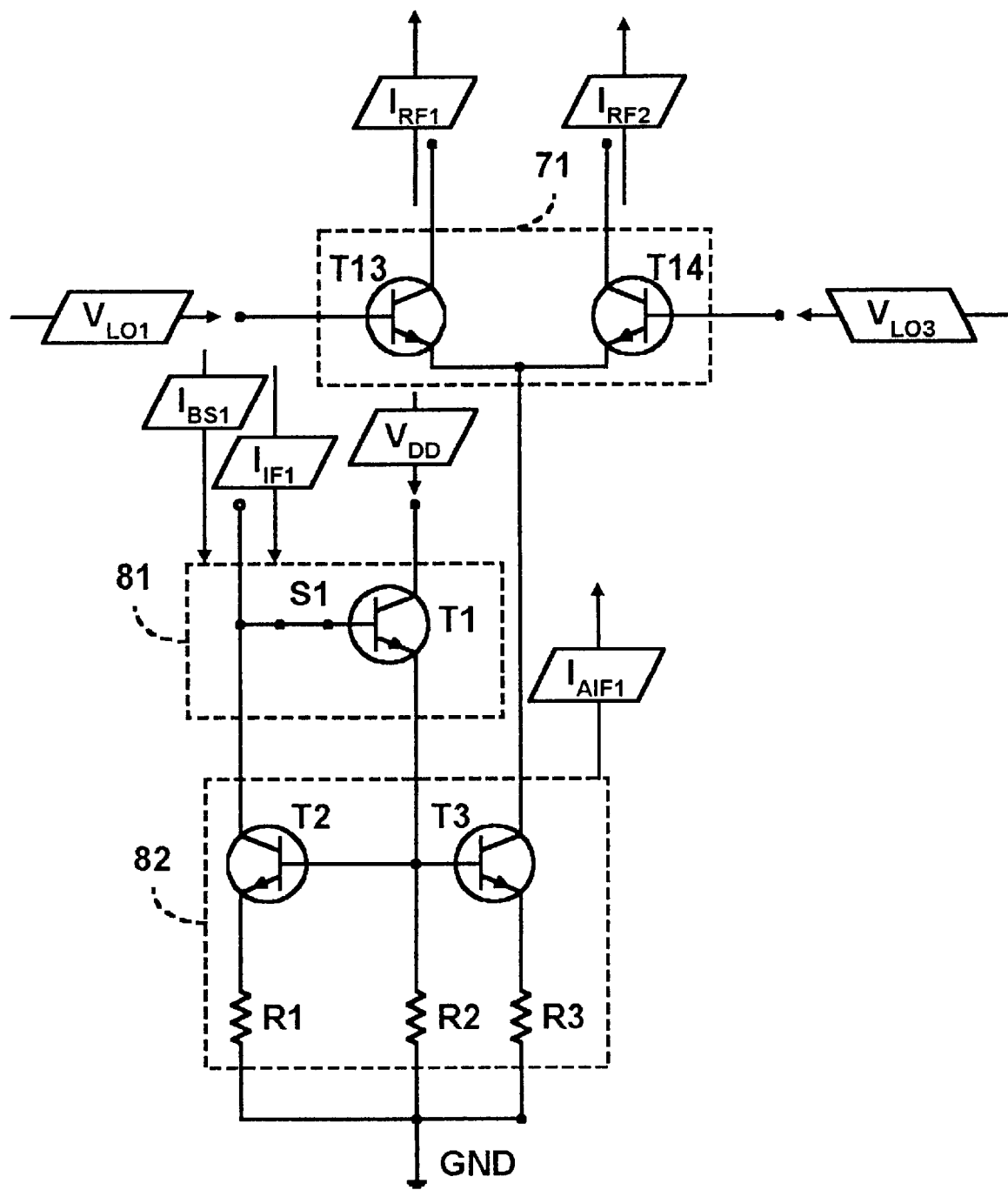
FIG. 5A is a schematic diagram of a first branch of the FIG. 4 power mixer.

Referring additionally to FIG. 5A, a supply voltage $V_{DD}$ is applied to supply terminal SUPPLY$_1$. Switching circuit 81 shunts DC current biasing signal $I_{BS1}$ and current intermediate frequency signal $I_{IF1}$ when switch S1 is in an open position as shown in FIG. 4. As a result, current mirror 82 is inactive and switching circuit 71 is turned off. Conversely, switching circuit 81 receives DC current biasing signal $I_{BS1}$ and current intermediate frequency signal $I_{IF1}$ when switch S1 is in a closed position as shown in FIG. 5A. Concurrently, voltage local oscillating signal $V_{LO1}$ is applied to a base terminal of transistor T13 and voltage local oscillating signal $V_{LO3}$ is applied to a base terminal of transistor T14.

As a result, current mirror 82 is active and switching circuit 71 is turned on whereby transistor T13 and transistor T14 individually activated to alternatively draw current intermediate frequency signal $I_{AIF1}$ from current mirror 82. As a result, a current radio frequency signal $I_{RF1}$ flows from the collector terminal of transistor T13 to OUTPUT$_1$ when transistor T13 is activated and a current radio frequency signal $I_{RF2}$ flows from the collector terminal of transistor T14 to OUTPUT$_2$ when transistor T14 is activated.

As previously described herein in connection with FIG. 3, current intermediate frequency signal $I_{AIF1}$ is an amplification of current intermediate frequency signal $I_{IF1}$. The amplification is due to a current gain of current mirror 82 that is function of a ratio of a size of transistor T3 to a size of transistor T2. Ideally, the size of transistor T2 and the size of transistor T3 are selected whereby the gain is in the order of 10 or higher. Those having ordinary skill in the art will appreciate that gain of current mirror 82 remains essentially constant over any variations in a temperature, a supply voltage, or a processing performance of transmitter chip 10 (FIG. 1).

Resistor R1 and resistor R3 serve to improve the gain consistency of current mirror 82 over any variations in a temperature, a supply voltage, or a processing performance of transmitter chip 10 by drawing and degrading currents (not shown) from the emitter terminals of transistor T2 and transistor T3. Resistor R2 serves to further improve the gain consistency of current mirror 82 by drawing a current (not shown) from an emitter terminal of transistor T1.

Referring again to FIG. 4, a second branch of lower tree 80 includes a switching circuit 83 and a current mirror 84 constituting a current amplifier, and a second branch of upper tree 70 includes a switching circuit 72. Switching circuit 83 includes a switch S2 and an NPN transistor T4. Current mirror 84 includes an NPN transistor T5, an NPN transistor T6, a resistor R4, a resistor R5, and a resistor R6. Switching circuit 72 includes an NPN transistor T15 and an NPN transistor T16.

Transistor T4 has a collector terminal electrically coupled to a supply terminal SUPPLY$_2$, and a base terminal electrically coupled to switch S2. Switch S2 receives a control signal (not shown) from the control block (not shown) of transmitter chip 10 (FIG. 1) that controls a selective opening and closing of switch S2. Transistor T5 has a collector terminal electrically coupled in parallel with switch S2 to an input terminal INPUT$_2$. Transistor T5 also has an emitter terminal electrically coupled to a resistor R4.

Transistor T6 has a base terminal electrically coupled to an emitter terminal of transistor T4, a base terminal of transistor T5, and resistor R5. A collector terminal of transistor T6 is electrically coupled to both an emitter terminal of transistor T15 and an emitter terminal of transistor T16. An emitter terminal of transistor T6 is electrically coupled to resistor R6. Resistors R4–R6 are electrically coupled in parallel to ground GND.

Transistor T15 has a collector terminal electrically coupled to an output terminal OUTPUT$_1$, and transistor T16 has a collector terminal electrically coupled to an output terminal OUTPUT$_2$.

Figure 5B:
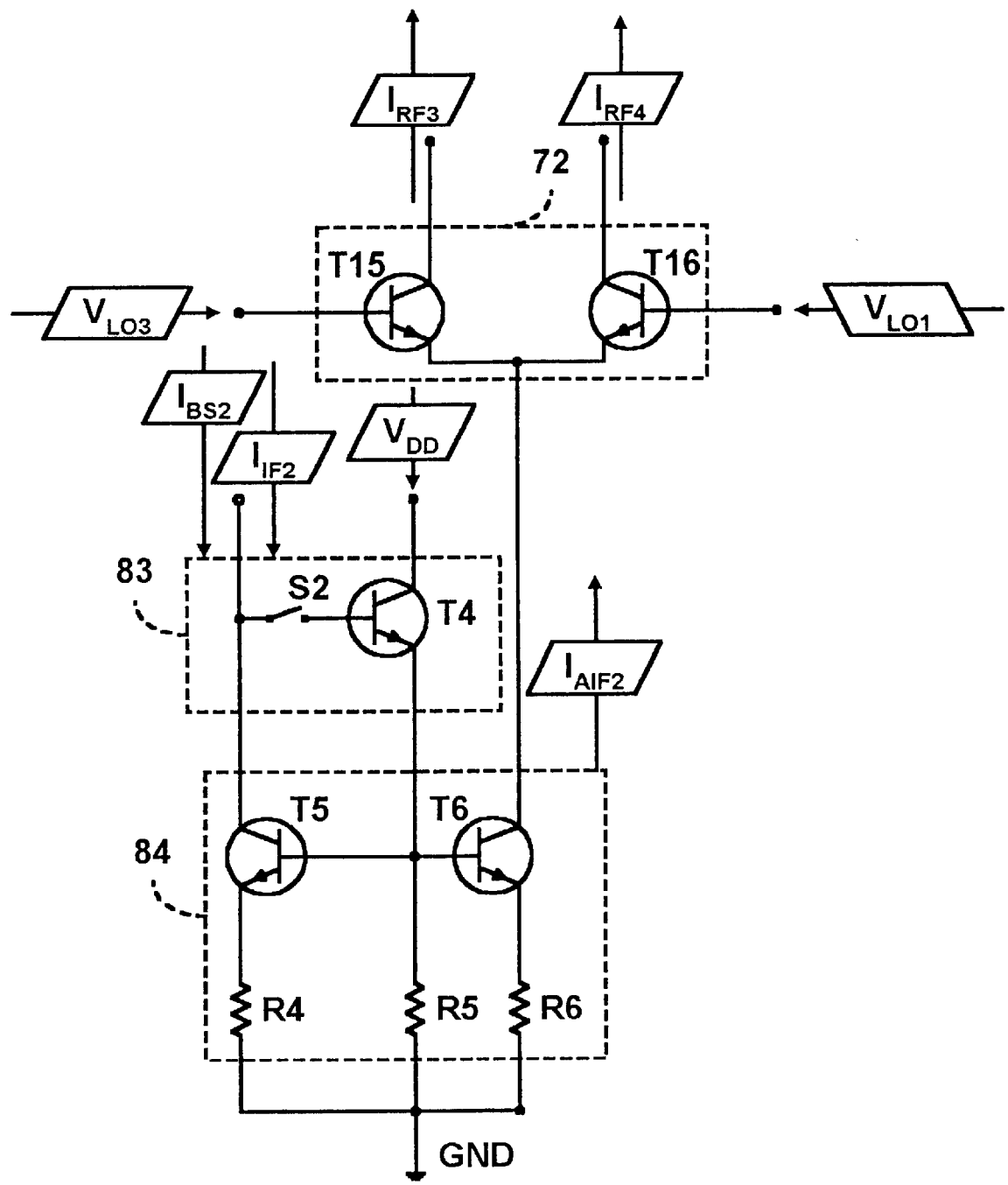
FIG. 5B is a schematic diagram of a second branch of the FIG. 4 power mixer.

Referring additionally to FIG. 5B, a supply voltage $V_{DD}$ is applied to supply terminal SUPPLY$_2$. Switching circuit 83 shunts DC current biasing signal $I_{BS2}$ and current intermediate frequency signal $I_{IF2}$ when switch S2 is in an open position as shown in FIG. 4. As a result, current mirror 84 is inactive and switching circuit 72 is turned off. Conversely, switching circuit 83 receives DC current biasing signal $I_{BS2}$ and current intermediate frequency signal $I_{IF2}$ when switch S2 is in a closed position as shown in FIG. 5B. Concurrently, voltage local oscillating signal $V_{LO3}$ is applied to a base terminal of transistor T15 and voltage local oscillating signal $V_{LO1}$ is applied to a base terminal of transistor T16.

As a result, current mirror 84 is active and switching circuit 72 is turned on whereby transistor T15 and transistor T16 individually activated to alternatively draw current intermediate frequency signal $I_{AIF2}$ from current mirror 84. As a result, a current radio frequency signal $I_{RF3}$ flows from the collector terminal of transistor T15 to OUTPUT$_1$ when transistor T15 is activated and a current radio frequency signal $I_{RF4}$ flows from the collector terminal of transistor T16 to OUTPUT$_2$ when transistor T16 is activated.

As previously described herein in connection with FIG. 3, current intermediate frequency signal $I_{AIF2}$ is an amplification of current intermediate frequency signal $I_{IF2}$. The amplification is due to a current gain of current mirror 84 that is function of a ratio of a size of transistor T6 to a size of transistor T5. Ideally, the size of transistor T5 and the size of transistor T5 are selected whereby the gain is in the order of 10 or higher. Those having ordinary skill in the art will appreciate that gain of current mirror 84 remains essentially constant over any variations in a temperature, a supply voltage, or a processing performance of transmitter chip 10 (FIG. 1).

Resistor R4 and resistor R6 serve to improve the gain consistency of current mirror 84 over any variations in a temperature, a supply voltage, or a processing performance of transmitter chip 10 by drawing and degrading currents (not shown) from the emitter terminals of transistor T5 and transistor T6. Resistor R5 serves to further improve the gain consistency of current mirror 84 by drawing a current (not shown) from an emitter terminal of transistor T4.

Referring again to FIG. 4, a third branch of lower tree 80 includes a switching circuit 85 and a current mirror 86 constituting a current amplifier, and a third branch of upper tree 70 includes a switching circuit 73. Switching circuit 85 includes a switch S3 and an NPN transistor T7. Current mirror 86 includes an NPN transistor T8, an NPN transistor T9, a resistor R7, a resistor R8, and a resistor R9. Switching circuit 73 includes an NPN transistor T17 and an NPN transistor T18.

Transistor T7 has a collector terminal electrically coupled to a supply terminal SUPPLY$_3$, and a base terminal electrically coupled to switch S3. Switch S3 receives a control signal (not shown) from the control block (not shown) of transmitter chip 10 (FIG. 1) that controls a selective opening and closing of switch S3. Transistor T8 has a collector terminal electrically coupled in parallel with switch S3 to an input terminal INPUT$_3$. Transistor T8 also has an emitter terminal electrically coupled to a resistor R7.

Transistor T9 has a base terminal electrically coupled to an emitter terminal of transistor T7, a base terminal of transistor T8, and resistor R8. A collector terminal of transistor T9 is electrically coupled to both an emitter terminal of transistor T17 and an emitter terminal of transistor T18. An emitter terminal of transistor T9 is electrically coupled to resistor R9. Resistors R7–R9 are electrically coupled in parallel to ground GND.

Transistor T17 has a collector terminal electrically coupled to an output terminal OUTPUT$_1$, and transistor T18 has a collector terminal electrically coupled to an output terminal OUTPUT$_2$.

Figure 5C:
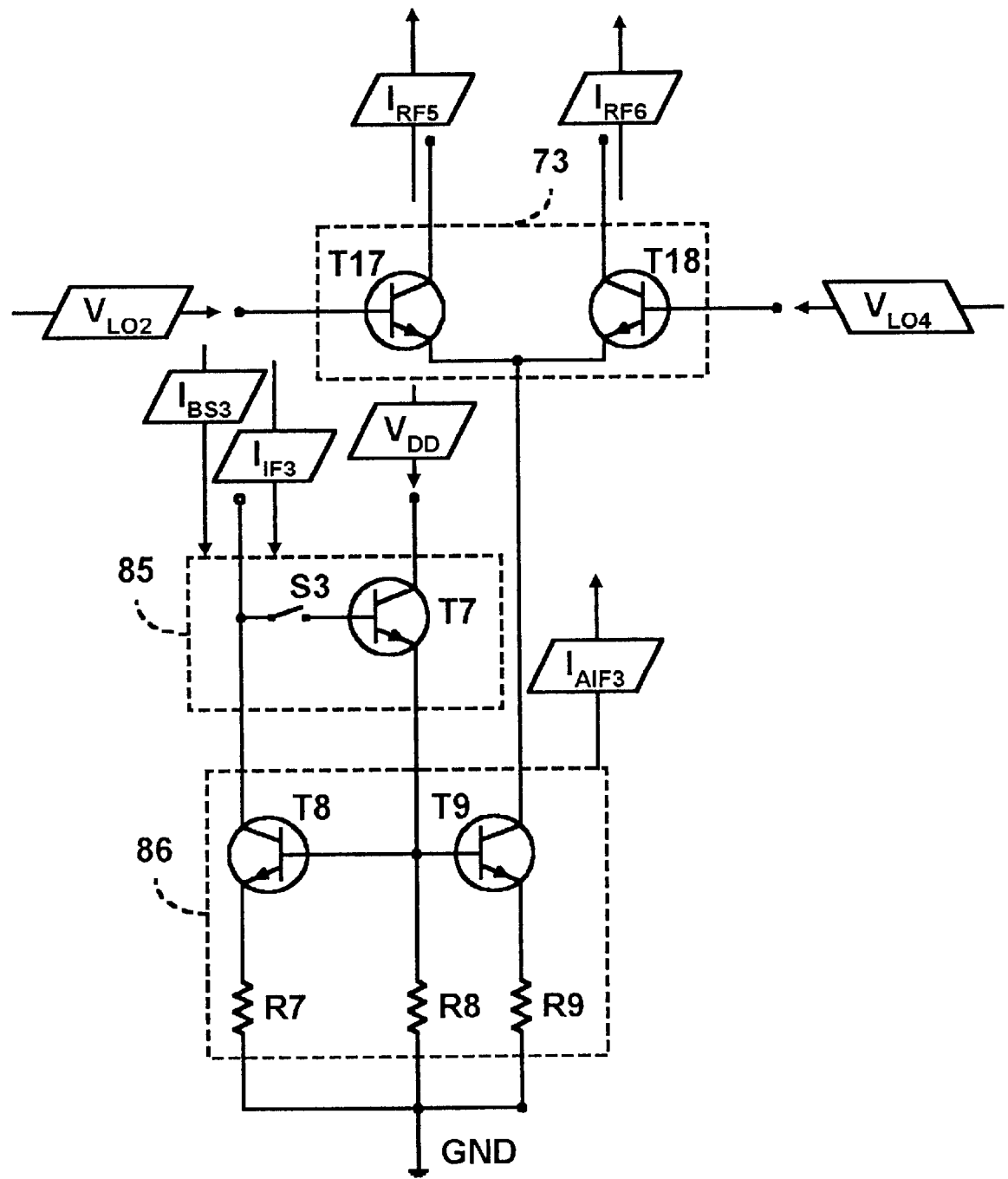
FIG. 5C is a schematic diagram of a third branch of the FIG. 4 power mixer.

Referring additionally to FIG. 5C, a supply voltage VDD is applied to supply terminal SUPPLY$_3$. Switching circuit 85 shunts DC current biasing signal I$_{BS3}$ and current intermediate frequency signal I$_{IF3}$ when switch S3 is in an open position as shown in FIG. 4. As a result, current mirror 86 is inactive and switching circuit 73 is turned off. Conversely, switching circuit 85 receives DC current biasing signal I$_{BS3}$ and current intermediate frequency signal I$_{IF3}$ when switch S3 is in a closed position as shown in FIG. 5C. Concurrently, voltage local oscillating signal V$_{LO2}$ is applied to a base terminal of transistor T17 and voltage local oscillating signal V$_{LO4}$ is applied to a base terminal of transistor T18.

As a result, current mirror 86 is active and switching circuit 73 is turned on whereby transistor T17 and transistor T18 individually activated to alternatively draw current intermediate frequency signal I$_{AIF3}$ from current mirror 86. As a result, a current radio frequency signal I$_{RF5}$ flows from the collector terminal of transistor T17 to OUTPUT$_1$ when transistor T17 is activated and a current radio frequency signal I$_{RF6}$ flows from the collector terminal of transistor T18 to OUTPUT$_2$ when transistor T18 is activated.

As previously described herein in connection with FIG. 3, current intermediate frequency signal I$_{AIF3}$ is an amplification of current intermediate frequency signal I$_{IF3}$. The amplification is due to a current gain of current mirror 86 that is function of a ratio of a size of transistor T9 to a size of transistor T8. Ideally, the size of transistor T8 and the size of transistor T9 are selected whereby the gain is in the order of 10 or higher. Those having ordinary skill in the art will appreciate that gain of current mirror 86 remains essentially constant over any variations in a temperature, a supply voltage, or a processing performance of transmitter chip 10 (FIG. 1).

Resistor R7 and resistor R9 serve to improve the gain consistency of current mirror 86 over any variations in a temperature, a supply voltage, or a processing performance of transmitter chip 10 by drawing and degrading currents (not shown) from the emitter terminals of transistor T8 and transistor T9. Resistor R8 serves to further improve the gain consistency of current mirror 86 by drawing a current (not shown) from an emitter terminal of transistor T7.

Referring again to FIG. 4, a fourth branch of lower tree 80 includes a switching circuit 87 and a current mirror 88 constituting a current amplifier, and a fourth branch of upper tree 70 includes a switching circuit 74. Switching circuit 87 includes a switch S4 and an NPN transistor T10. Current mirror 88 includes an NPN transistor T11, an NPN transistor T12, a resistor R10, a resistor R11, and a resistor R12. Switching circuit 74 includes an NPN transistor T19 and an NPN transistor T20.

Transistor T10 has a collector terminal electrically coupled to a supply terminal SUPPLY$_4$, and a base terminal electrically coupled to switch S4. Switch S4 receives a control signal (not shown) from the control block (not shown) of transmitter chip 10 (FIG. 1) that controls a selective opening and closing of switch S4. Transistor T11 has a collector terminal electrically coupled in parallel with switch S4 to an input terminal INPUT$_4$. Transistor T11 also has an emitter terminal electrically coupled to a resistor R10.

Transistor T12 has a base terminal electrically coupled to an emitter terminal of transistor T10, a base terminal of transistor T11, and resistor R11. A collector terminal of transistor T12 is electrically coupled to both an emitter terminal of transistor T19 and an emitter terminal of transistor T20. An emitter terminal of transistor T12 is electrically coupled to resistor R12. Resistors R10–R12 are electrically coupled in parallel to ground GND.

Transistor T19 has a collector terminal electrically coupled to an output terminal OUTPUT$_1$, and transistor T20 has a collector terminal electrically coupled to an output terminal OUTPUT$_2$.

Figure 5D:
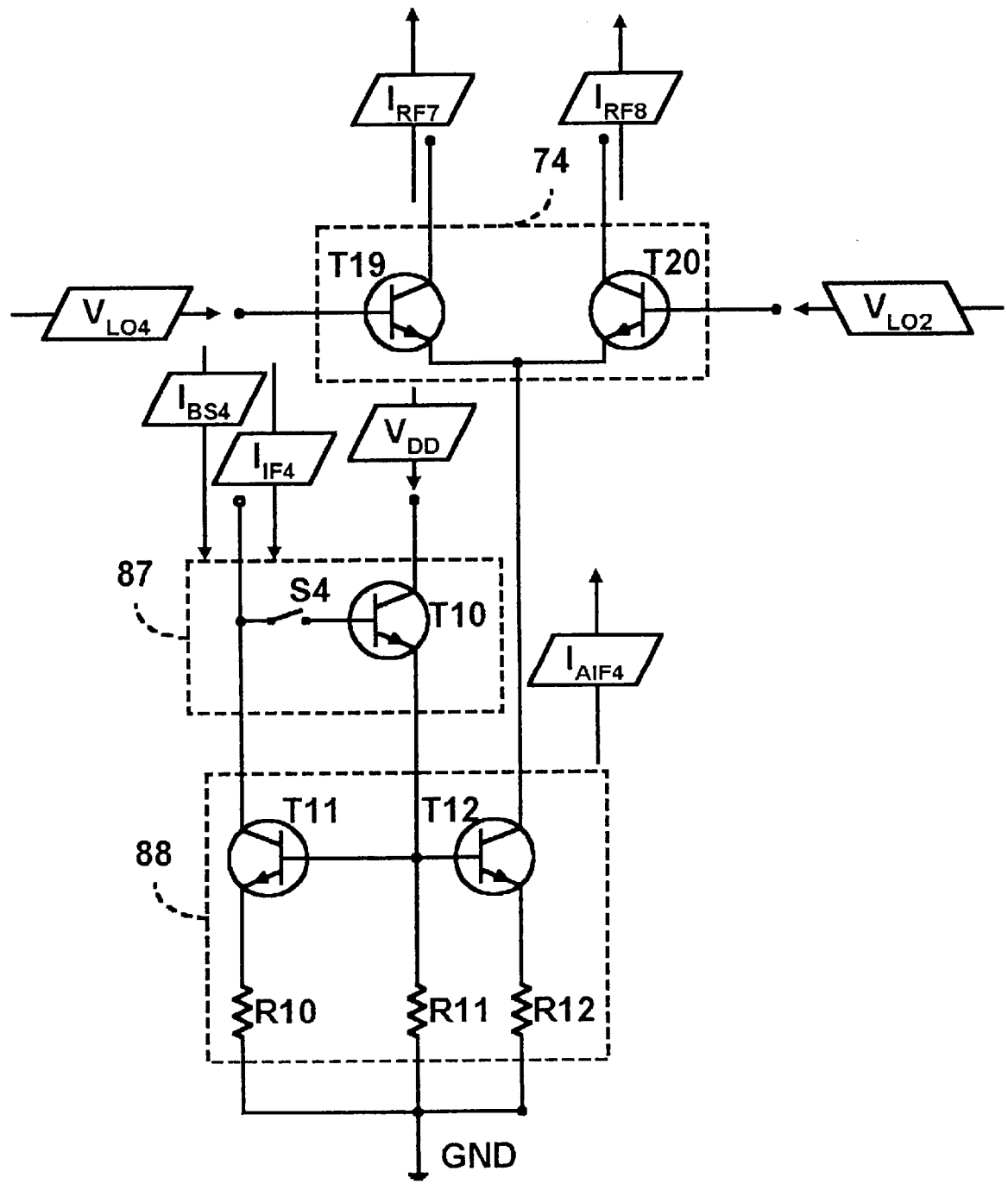
FIG. 5D is a schematic diagram of a fourth branch of the FIG. 4 power mixer.

Referring additionally to FIG. 5D, a supply voltage V$_{DD}$ is applied to supply terminal SUPPLY$_4$. Switching circuit 87 shunts DC current biasing signal I$_{BS4}$ and current intermediate frequency signal I$_{IF4}$ when switch S4 is in an open position as shown in FIG. 4. As a result, current mirror 88 is inactive and switching circuit 74 is turned off. Conversely, switching circuit 87 receives DC current biasing signal I$_{BS4}$ and current intermediate frequency signal I$_{IF4}$ when switch S4 is in a closed position as shown in FIG. 5D. Concurrently, voltage local oscillating signal V$_{LO4}$ is applied to a base terminal of transistor T19 and voltage local oscillating signal V$_{LO2}$ is applied to a base terminal of transistor T20.

As a result, current mirror 88 is active and switching circuit 74 is turned on whereby transistor T19 and transistor T20 individually activated to alternatively draw current intermediate frequency signal I$_{AIF4}$ from current mirror 88. As a result, a current radio frequency signal I$_{RF7}$ flows from the collector terminal of transistor T19 to OUTPUT$_1$ when transistor T19 is activated and a current radio frequency signal I$_{RF8}$ flows from the collector terminal of transistor T20 to OUTPUT$_2$ when transistor T20 is activated.

As previously described herein in connection with FIG. 3, current intermediate frequency signal I$_{AIF4}$ is an amplification of current intermediate frequency signal I$_{IF4}$. The amplification is due to a current gain of current mirror 88 that is function of a ratio of a size of transistor T12 to a size of transistor T11. Ideally, the size of transistor T11 and the size of transistor T12 are selected whereby the gain is in the order of 10 or higher. Those having ordinary skill in the art will appreciate that gain of current mirror 88 remains essentially constant over any variations in a temperature, a supply voltage, or a processing performance of transmitter chip 10 (FIG. 1).

Resistor R10 and resistor R12 serve to improve the gain consistency of current mirror 88 over any variations in a temperature, a supply voltage, or a processing performance of transmitter chip 10 by drawing and degrading currents (not shown) from the emitter terminals of transistor T11 and transistor T12. Resistor R11 serves to further improve the gain consistency of current mirror 88 by drawing a current (not shown) from an emitter terminal of transistor T10.

Figure 6:
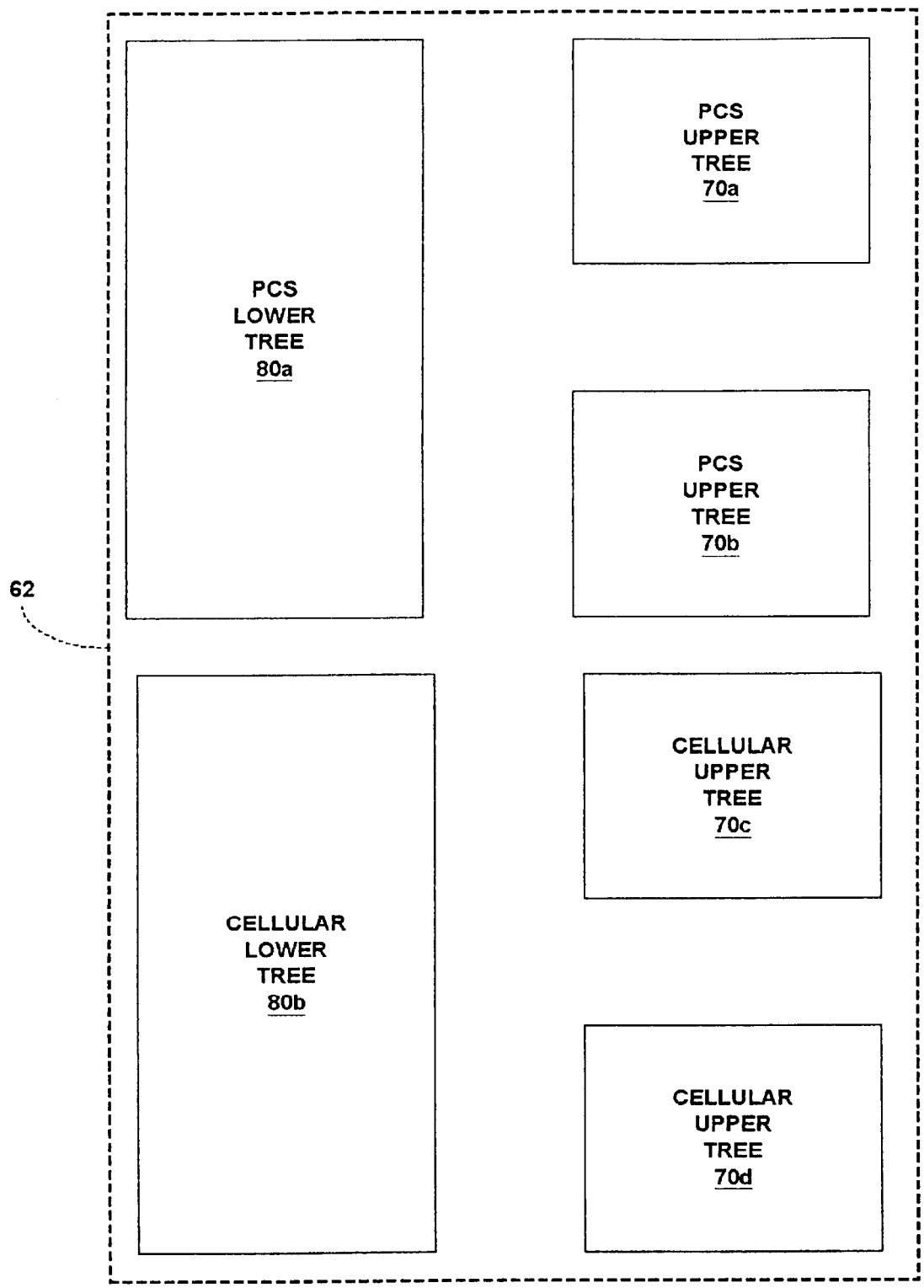
FIG. 6 is a block diagram of a second embodiment in accordance with the present invention of a mixing stage of the FIG. 1 transmitter power mixer chip.

Referring to FIG. 6, a mixing stage 62 as an embodiment of mixing stage 60 (FIG. 1) is shown. Mixing stage 62 includes a personal communication system (PCS) lower tree 80a, and a cellular lower tree 80b. Lower tree 80a and lower tree 80b are replicas of the circuitry of lower tree 80 as shown in FIG. 4. Mixing stage 62 further includes a personal communication system (PCS) upper tree 70a, a personal communication system (PCS) upper tree 70b, a cellular upper tree 70c, and a cellular upper tree 70d. Upper trees 70a–70d are replicas of the circuitry of upper tree 70 as shown in FIG. 4. Transmitter chip 10 (FIG. 1) includes four (4) external baluns (not shown). PSC upper tree 70a is operable to provide voltage radio frequency signal V$_{RF1}$ and voltage radio frequency signal V$_{RF2}$ at a frequency approximating 1900 MHz to a first external balun. PSC upper tree 70b is operable to provide voltage radio frequency signal V$_{RF1}$ and voltage radio frequency signal V$_{RF2}$ at a frequency approximating 1900 MHz to a second external balun. Cellular upper tree 70c is operable to provide voltage radio frequency signal $V_{RF1}$ and voltage radio frequency signal $V_{RF2}$ at a frequency approximating 800 MHz to a third external balun. Cellular upper tree 70d operable to provide voltage radio frequency signal $V_{RF1}$ and voltage radio frequency signal $V_{RF2}$ at a frequency approximating 800 MHz to a fourth external balun.

From the subsequent description herein of mixing stage 62 in connection with FIGS. 7A–7D, those having ordinary skill in the art will appreciate a simple output power switching scheme provided by the present invention.

Figure 7A:
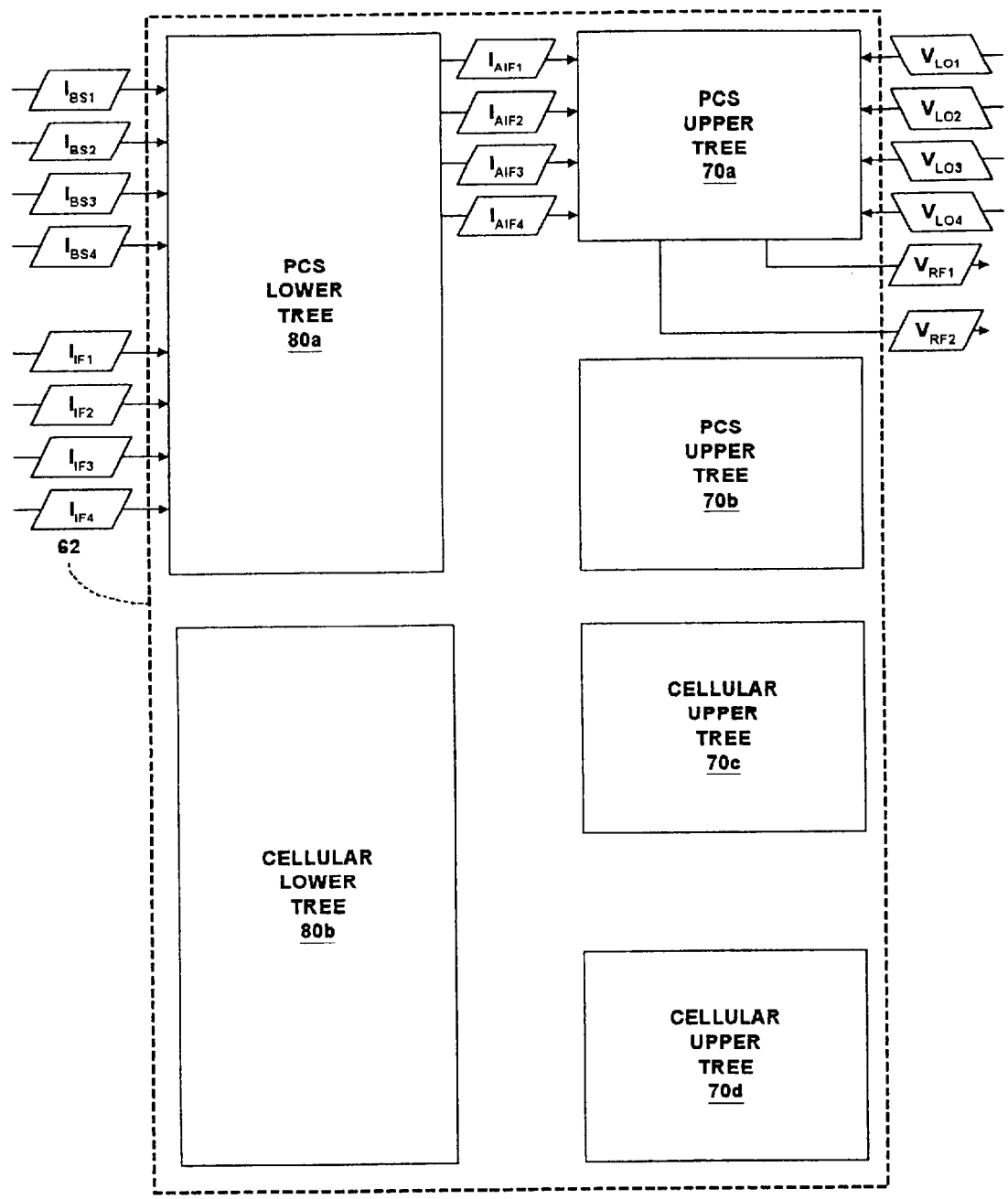
FIG. 7A is a block diagram of an activation of a PCS lower tree and a first PCS upper tree of the FIG. 6 mixing stage.

Referring to FIGS. 4 and 7A–7D, as previously stated herein, switches S1–S4 are selectively opened and closed in response to a reception of control signals (not shown), respectively, from a control block (not shown) of transmitter chip 10 (FIG. 1). Additionally, voltage local oscillating signals $V_{LO1-LO4}$ are selectively provided to one of the upper trees 70a–70d by way of switching means (not shown) within the local oscillator driver stage 50 (FIG. 1). Thus, when it is desired for the first external balun to receive voltage radio frequency signal $V_{RF1}$ and voltage radio frequency signal $V_{RF2}$ at a frequency approximating 1900 MHz, switches S1–S4 of lower tree 80a are closed and switches S1–S4 of lower tree 80b are opened whereby only lower tree 80a receives DC current biasing signals $I_{BS1-BS4}$ and current intermediate frequency signals $V_{IF1-IF4}$ to thereby provide current intermediate frequency signals $V_{AIF1-AIF4}$ to upper tree 70a as shown in FIG. 7A. Additionally, voltage local oscillating signals $V_{LO1-LO4}$ are only provided to upper tree 70a whereby upper tree 70a provides voltage radio frequency signal $V_{RF1}$ and voltage radio frequency signal $V_{RF2}$ at a frequency approximating 1900 MHz to the first balun.

Figure 7B:
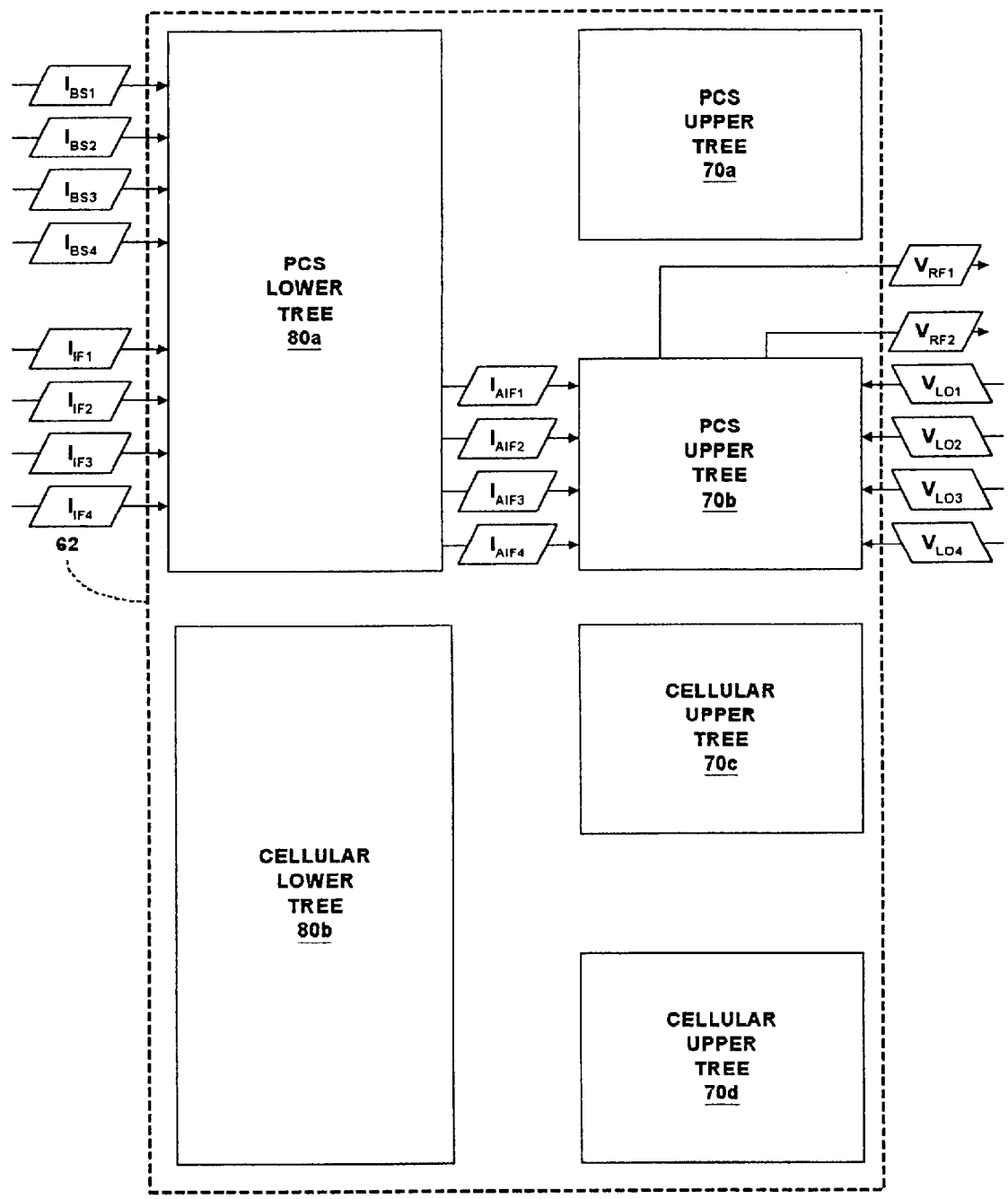
FIG. 7B is a block diagram of an activation of the PCS lower tree and a second PCS upper tree of the FIG. 6 mixing stage.

Alternatively, when it is desired for the second external balun to receive voltage radio frequency signal $V_{RF1}$ and voltage radio frequency signal $V_{RF2}$ at a frequency approximating 1900 MHz, switches S1–S4 of lower tree 80a are closed and switches S1–S4 of lower tree 80b are opened whereby only lower tree 80a receives DC current biasing signals $I_{BS1-BS4}$ and current intermediate frequency signals $V_{IF1-IF4}$ to thereby provide current intermediate frequency signals $V_{AIF1-AIF4}$ to upper tree 70b as shown in FIG. 7B. Additionally, voltage local oscillating signals $V_{LO1-LO4}$ are only provided to upper tree 70b whereby upper tree 70b provides voltage radio frequency signal $V_{RF1}$ and voltage radio frequency signal $V_{RF2}$ at a frequency approximating 1900 MHz to the second external balun.

Figure 7C:
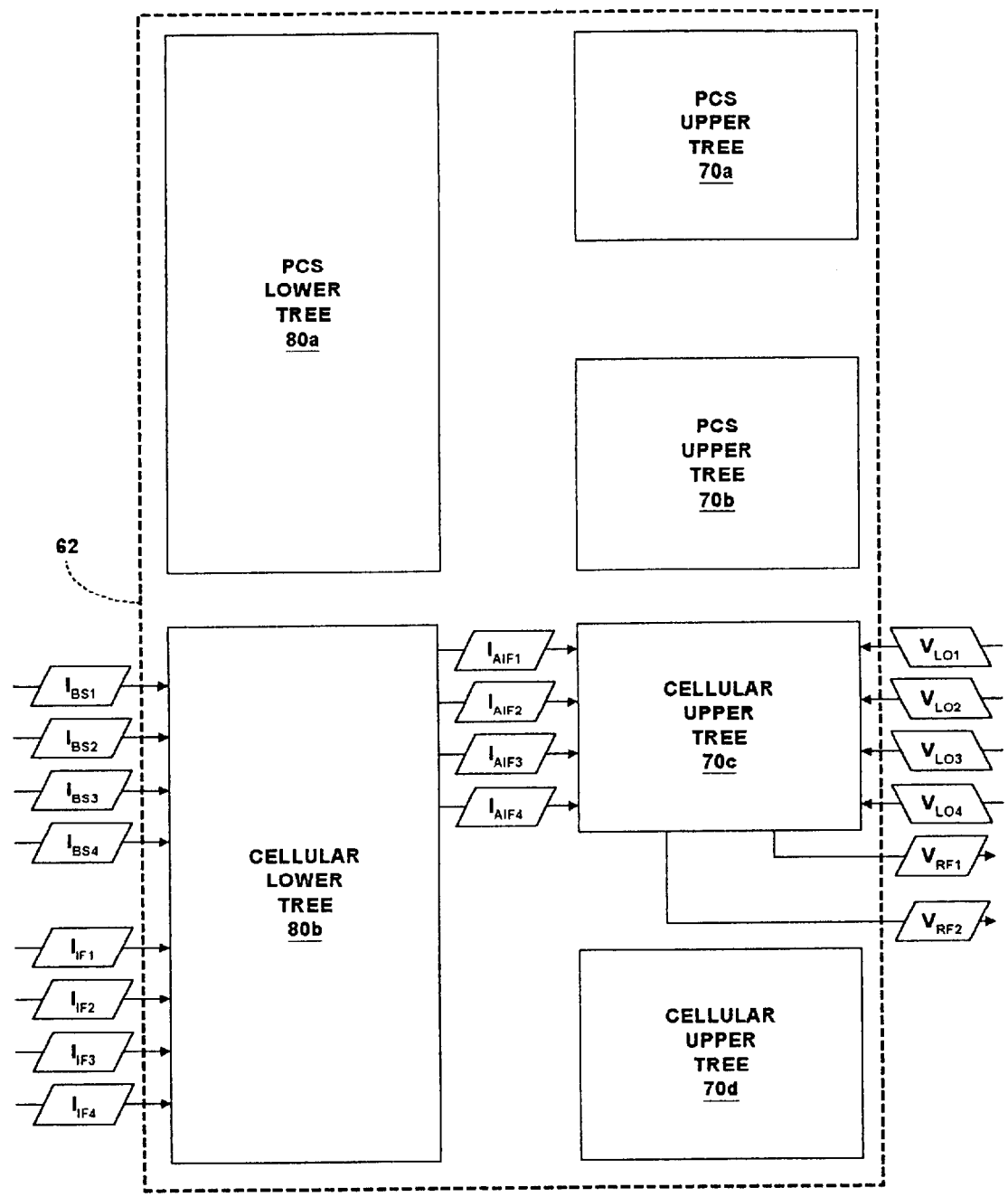
FIG. 7C is a block diagram of an activation of a cellular lower tree and a first cellular upper tree of the FIG. 6 mixing stage.

Alternatively, when it is desired for the third external balun to receive voltage radio frequency signal $V_{RF1}$ and voltage radio frequency signal $V_{RF2}$ at a frequency approximating 800 MHz, switches S1–S4 of lower tree 80a are opened and switches S1–S4 of lower tree 80b are closed whereby only lower tree 80b receives DC current biasing signals $I_{BS1-BS4}$ and current intermediate frequency signals $V_{IF1-IF4}$ to thereby provide current intermediate frequency signals $V_{AIF1-AIF4}$ to upper tree 70c as shown in FIG. 7C. Additionally, voltage local oscillating signals $V_{LO1-LO4}$ are only provided to upper tree 70c whereby upper tree 70c provides voltage radio frequency signal $V_{RF1}$ and voltage radio frequency signal $V_{RF2}$ at a frequency approximating 800 MHz to the third external balun.

Figure 7D:
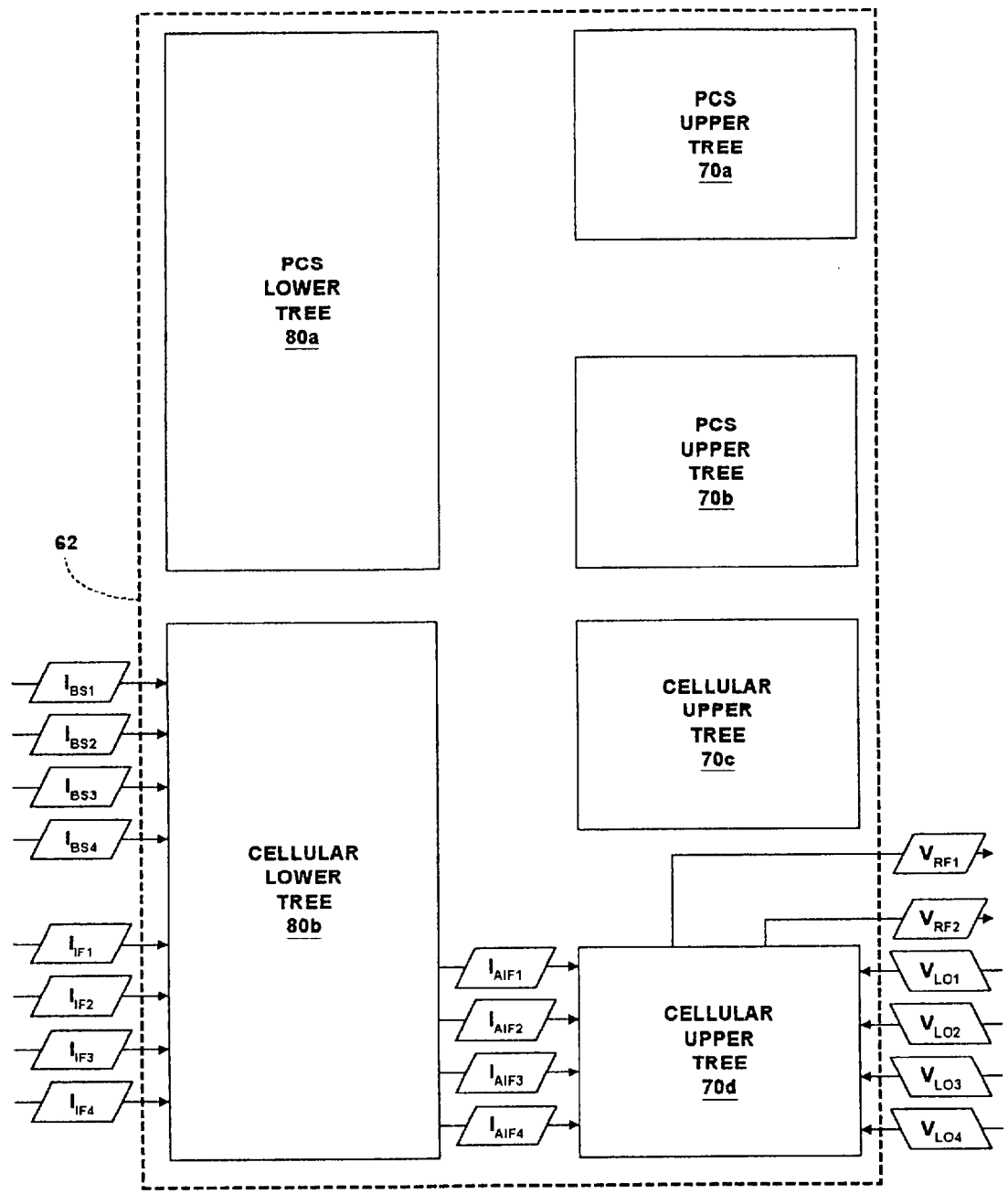
FIG. 7D is a block diagram of an activation of the cellular lower tree and a first cellular upper tree of the FIG. 6 mixing stage.

Alternatively, when it is desired for the fourth external balun to receive voltage radio frequency signal $V_{RF1}$ and voltage radio frequency signal $V_{RF2}$ at a frequency approximating 800 MHz, switches S1–S4 of lower tree 80a are opened and switches S1–S4 of lower tree 80b are closed whereby only lower tree 80b receives DC current biasing signals $I_{BS1-BS4}$ and current intermediate frequency signals $V_{IF1-IF4}$ to thereby provide current intermediate frequency signals $V_{AIF1-AIF4}$ to upper tree 70d as shown in FIG. 7D. Additionally, voltage local oscillating Signals $V_{LO1-LO4}$ are only provided to upper tree 70d whereby upper tree 70d provides voltage radio frequency signal $V_{RF1}$ and voltage radio frequency signal $V_{RF2}$ at a frequency approximating 800 MHz to the fourth external balun.

While the embodiments of the present invention disclosed herein are presently considered to be preferred, various changes and modifications can be made without departing from the spirit and scope of the present invention. The scope of the present invention is indicated in the appended claims, and all changes that come within the meaning and range of equivalents are intended to be embraced therein.

What is claimed is:

1. A mixing stage of a transmitter chip, said mixing stage comprising:
   a lower tree operable provide a first current intermediate frequency signal in response to a reception of a second current intermediate frequency signal and a current biasing signal; and
   an upper tree operable to provide a voltage radio frequency signal in response to said first current intermediate frequency signal.

2. The mixing stage of claim 1, wherein
   said lower tree includes means for maintaining a constant gain.

3. The mixing stage of claim 1, wherein
   said first current intermediate frequency signal is an amplification of said second current intermediate frequency signal.

4. The mixing stage of claim 1, wherein
   said lower tree is selectively activated to receive said second current intermediate frequency signal and said current biasing signal; and
   said lower tree is selectively deactivated to shunt said second current intermediate frequency signal and said current biasing signal.

5. A mixing stage of a transmitter chip, said mixing stage comprising:
   an upper tree including a switching circuit; and
   a lower tree including a current amplifier operable to turn on said switching circuit in response to a reception of a first current intermediate frequency signal and a current biasing signal.

6. The mixing stage of claim 5, wherein
   said switching circuit is operable to draw a second current intermediate frequency signal from said current amplifier when said switching circuit is turned on, said second current intermediate frequency signal being an amplification of said first current intermediate frequency signal.

7. The mixing stage of claim 6, wherein
   said current amplifier includes means for establishing a gain that is independent of any variances in a temperature of said transmitter chip.

8. The mixing stage of claim 6, wherein
   said current amplifier includes means for establishing a gain that is independent of any variances in a supply voltage of said transmitter chip.

9. The mixing stage of claim 6, wherein
   said current amplifier includes means for establishing a gain that is independent of any variances in a processing performance of said transmitter chip.

10. The mixing stage of claim 5, wherein said current amplifier includes means for selectively receiving or shunting said first current intermediate frequency signal and said current biasing signal.

11. A transmitter chip, comprising:

a biasing stage operable to provide a plurality of current biasing signals;

a phase shifting stage operable to provide first set of a plurality of current intermediate frequency signals;

a local oscillator driver stage operable to provide a plurality of voltage local oscillating signals; and a mixing stage operable to provide a first voltage radio frequency signal and a second voltage radio frequency signal in response to a reception of said plurality of current biasing signals, said first set of said plurality of current intermediate frequency signals, and said plurality of voltage local oscillating signals.

12. The transmitter chip of claim 11, wherein said mixing stage includes at least one lower tree operable to receive said plurality of current biasing signals and said first set of said plurality of current intermediate frequency signals, and at least one upper tree operable to receive said plurality of voltage local oscillating signals.

13. The transmitter chip of claim 12, wherein each lower tree of said at least one lower tree includes means for selectively receiving or shunting said plurality of current biasing signals and said first set of said plurality of current intermediate frequency signals.

14. The transmitter of chip of claim 12, wherein a first lower tree of said at least one lower tree is operable to provide a second set of a plurality of current intermediate frequency signals in response to a reception of said plurality of current biasing signals and said first set of said plurality of current intermediate frequency signals; and a first upper tree of said at least one upper tree is operable to receive said second set of a plurality of current intermediate frequency signals in response to reception of said plurality of voltage local oscillating signals.

15. The transmitter chip of claim 12, wherein a first lower tree of said at least one lower tree includes means for maintaining a constant gain.

\* \* \* \* \*